June 25, 1968 G. A. BROWN ET AL 3,390,011

METHOD OF TREATING PLANAR JUNCTIONS

Filed March 23, 1965

GEORGE A. BROWN
HAROLD G. CARLSON
CLYDE R. FULLER
INVENTORS

BY John E. Vandigriff 3,390,011

METHOD OF TREATING PLANAR JUNCTIONS

George Axel Brown, Richardson, Clyde Rhea Fuller, Plano, and Harold Gary Carlson, Richardson, Tex., assignors to Texas Instruments Incorporated, Dallas, Tex., a corporation of Delaware Filed Mar. 23, 1965, Ser. No. 442,038
5 Claims. (Cl. 117—201)

ABSTRACT OF THE DISCLOSURE

Disclosed is a method for treating semiconductor devices to increase the breakdown voltage of the P—N junctions contained therein by treating said devices in a flowing atmosphere of nitric acid vapor.

This invention relates to semiconductor devices and more particularly to the treatment of planar junctions in such devices.

The characteristics of semiconductor devices are, in part, dependent upon conditions existing at their surfaces. In junction type devices, for example, the protection of the exposed portion of the rectifying barrier is especially important. Cleaning the surfaces of the device is very desirable because clean surfaces enhance the results obtained from subsequent oxidation of the surfaces. Oxidation alone, however, is relatively ineffective in producing stable surfaces unless they are cleaned before oxidation.

A problem associated with the manufacture of P+N planar junctions in a semiconductor device is the development of a surface condition that lowers the surface junction breakdown voltage below the bulk junction breakdown voltage. Thus, the breakdown voltage of planar diodes has been increased by various liquid chemical treatments of their surfaces. In general, however, there are two weaknesses in such treatments. First, the beneficial effects tend to be temporary and, second, the increase in breakdown voltage is accomplished by a corresponding increase in the leakage current, due to the formation of a surface conduction path which is usually very unstable.

It is therefore an object of the invention to provide a method of treating planar junctions that will increase the breakdown voltage.

Another object of the invention is to provide a method of treating planar junctions that will increase the breakdown voltage of a planar junction device without increasing the leakage current.

Another object of the invention is to provide a method of treating planar junctions to improve the electrical characteristics thereof.

Still another object of the invention is a method of treating semiconductor devices which inhibits the formation of a surface conduction path.

Another object of the invention is a method of treating planar junctions that will increase the surface junction breakdown voltage to a value approaching the breakdown voltage attainable at the bulk junction.

Other objects and features of the invention will become more readily understood from the following detailed description and appended claims when considered in conjunction with the accompanying drawing, in which:

In the manufacture of semiconductor devices, a small wafer of semiconductor material is prepared by cleaning it prior to the deposition and diffusion of impurity material to form PN junctions within the wafer. After diffusion, various other production steps follow which may contaminate the surface of the wafer. After all these steps have been performed, the wafer is again cleaned to remove contaminants that may be on the surface, one such contaminant may be, for example, masking material used to define contacts and placed thereon to confine contact areas to the particular desired patterns. Removal of these residues is necessary to prevent degradation of the device since, as previously indicated, the surface condition plays an important part in the determination of its voltage breakdown characteristics.

The present invention is a method of treating the surface of the device, after diffusion, to improve its electrical properties. An increase in breakdown voltage and a decrease in reverse current can be obtained by treating the semiconductor slices in a tube furnace at an elevated temperature with a mixture of gases flowing over the slices. Nitric acid is heated in a flask to a temperature near its boiling point, for example about 90–100° C., and nitrogen gas is bubbled therethrough, resulting in a vapor consisting of a mixture of water vapor, nitrogen, nitric acid ($HNO_3$) and nitric acid pyrolytic decomposition products. The resulting vapor is introduced into the furnace and allowed to flow over the diffused slices for about ten minutes. The nitric acid is commercially prepared and may be, for example, 70% $HNO_3$. The furnace is heated between 450–600° C. while the gas is flowing therethrough.

This process differs considerably from the mere boiling of the slices in nitric acid. In the boiling acid treatment, very few of the decomposition products are present. The nitric acid boiling is a liquid phase process whereas the process of the invention is a vapor phase reaction. The improvement in question is effected by the vapor phase, not by the liquid phase.

To illustrate the improvements resulting from the process, planar junctions were formed on devices in an N-type silicon substrate ranging from 5–50 ohm-cm. resistivity, by diffusing boron in said devices to a depth of approximately two mils. The reverse characteristics of certain of said devices were measured before and after treatment with the above process. Measurements were made of breakdown voltage and reverse current at several voltage levels. The resulting data is shown in Table I wherein:

Unit desc.=unit designation v.=voltage
na.=nanoamp ($10^{-9}$ amp.)
BV=breakdown voltage, and
Ir=reverse current.

It should be noted that in each case the breakdown voltage was greatly increased and the reverse current was substantially decreased.

Figure 1:
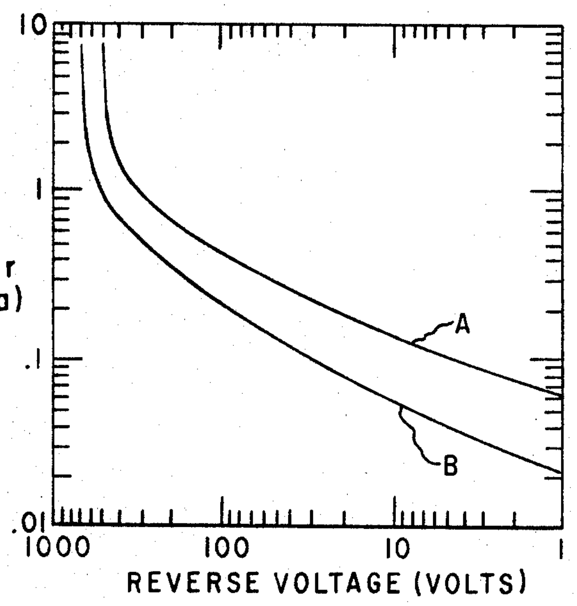
FIGURE 1 is a plot of reverse current-voltage characteristics before and after treating planar P+N junctions.

FIGURE 1 is a plot of the reverse current-voltage characteristic of a typical device showing the characteristics before the nitric acid vapor treatment (curve A) and the characteristics after the treatment (curve B). As shown by the data in Table I, the reverse current was reduced for a particular voltage level and the breakdown voltage of the device was increased. It is important to note from FIGURE 1 that the reverse current B for the treated slices does not differ in character from the reverse current A for the untreated slices. Only the magnitude of the current has decreased.

TABLE I

| Unit Desc. | Before Treatment: BV at $10^{-4}$ amp [v.] | Before Treatment: Ir at— 250 v. [na.] | Before Treatment: Ir at— 50 v. [na.] | After Treatment: BV at $10^{-4}$ amp [v.] | After Treatment: Ir at— 250 v. [na.] | After Treatment: Ir at— 50 v. [na.] |
|---|---|---|---|---|---|---|
| 10-1 | 375 | 0.48 | 0.13 | 430 | 0.09 | 0.058 |
| 10-2 | 375 | 0.55 | 0.15 | 430 | 0.10 | 0.055 |
| 10-3 | 380 | 0.69 | 0.19 | 425 | 0.11 | 0.035 |
| 10-4 | 380 | 0.66 | 0.18 | 410 | 0.075 | 0.025 |
| 10-5 | 395 | 0.60 | 0.17 | 425 | 0.09 | 0.034 |
| 10-6 | 375 | 0.58 | 0.16 | 410 | 0.07 | 0.025 |
| 10-7 | 380 | 0.58 | 0.16 | 410 | 0.075 | 0.03 |
| 10-8 | 380 | 0.58 | 0.15 | 425 | 0.10 | 0.04 |
| 10-9 | 375 | 0.74 | 0.35 | 420 | 0.10 | 0.04 |
| 10-10 | | 0.58 | 0.15 | 420 | 0.08 | 0.025 |
| | | Ir at— 400 v. [na.] | Ir at— 100 v. [na.] | | Ir at— 400 v. [na.] | Ir at— 100 v. [na.] |
| 10-5 | 515 | 2.15 | 0.56 | 640 | 1.35 | 0.37 |
| 10-7 | 530 | 1.45 | 0.42 | 590 | 0.60 | 0.21 |
| 10-10 | 500 | 1.6 | 0.38 | 640 | 0.64 | 0.29 |
| 10-12 | 480 | 3.0 | 0.78 | 620 | 1.9 | 0.78 |
| S-12 | 500 | 3.4 | 0.48 | 610 | 2.7 | 0.44 |
| J-1 | 810 | 1.65 | 0.68 | 980 | 0.98 | 0.46 |
| J-2 | 780 | 1.82 | 0.7 | 980 | 1.2 | 0.55 |
| J-3 | 780 | 2.0 | 0.75 | 980 | 1.42 | 0.62 |
| J-4 | 780 | 1.82 | 0.74 | 970 | 1.35 | 0.70 |
| J-5 | 770 | 1.8 | 0.73 | 980 | 1.4 | 0.73 |
| | | | (225 v.) | | | (225 v.) |
| 10-1 | 660 | 0.72 | 0.43 | 800 | 0.28 | 0.21 |
| 10-2 | 650 | 0.86 | 0.44 | 800 | 0.37 | 0.28 |
| 10-3 | 640 | 0.68 | 0.40 | 790 | 0.35 | 0.31 |
| 10-7 | 690 | 1.1 | 0.62 | 800 | 0.56 | 0.35 |

In addition to the voltage and current improvements, an increase of the $H_{fe}$ of transistors results from the vapor treatment. $H_{fe}$ is current gain of a transistor in a common emitter circuit.

Often times improvements in device characteristics are only temporary and do not survive packaging procedures. To determine if the improvement produced by the present invention would last over the lifetime of the device, tests were conducted by operating some of the treated devices at elevated temperatures. A number of devices from one of the slices was diced and randomly separated into two groups, one of which groups was treated with nitric acid vapor and the other was not. The units were packaged and prepared for testing.

Figure 2:
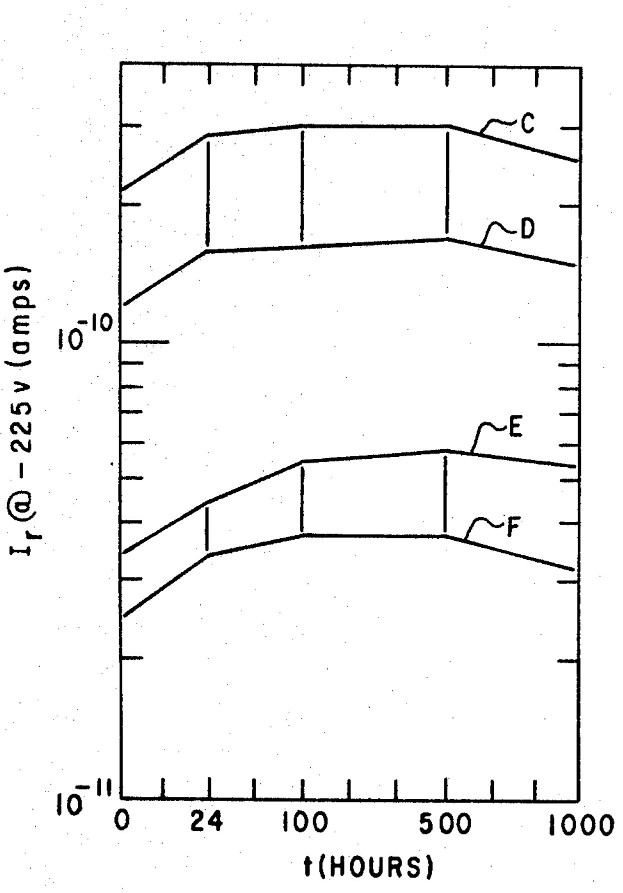
FIGURE 2 shows the distribution limits for reverse current for one group of devices which was treated by the method of the present invention and another group which was not so treated.

FIGURE 2 shows the distribution limits for reverse current at −225 volts for the two groups of 50 units each under test after 24, 100, 500 and 1000 hours of testing. Curves C and D indicate the distribution of the reverse currents for the untreated units under test. Curves E and F show the distribution of a reverse current for the treated units. It may be observed that the improvement brought about by the vapor treatment is permanent, that is, the reduction in reverse current is permanent, and the reverse current does not return to the value of the reverse current before treatment, even after 1000 hours of testing.

To determine at which part of the device, at the surface or in the bulk, the reduction of reverse current was effected, another test was conducted. A group of devices were fabricated as described above, except that junction of 18 and 50 mil diameters were formed in the same diffusion step. Because of the different area-to-periphery ratio of the two junction sizes, it was possible to separate bulk and surface oriented components of the reverse current. The area ratio of the two junction sizes was $A_{50}/A_{18}=5.6$ while the periphery ratio was $P_{50}/P_{18}=2.5$. Reverse I–V characteristics of the identified junctions of both sizes were measured before and after treatment with hot nitric acid vapor.

Table II shows the reverse currents of the junctions at the reverse bias level of 10 volts and the ratios before and after the vapor treatment. Before treatment, the reverse current ratio was 2.7, indicating that the characteristic was dominated by the surface or periphery oriented current component. After treatment, however, the current ratio of 4.8 shows that the surface component has been largely eradicated, and the reverse current characteristic was predominantly made up of bulk or area dependent current, thus indicating that the improvement occurred at the surface of the device when the reverse current was reduced.

TABLE II.—REVERSE JUNCTION CURRENT AT −10 V. ON 18 AND 50 MIL JUNCTIONS BEFORE AND AFTER TREATMENT WITH NITRIC ACID VAPOR

[Reverse Currents Averaged For Each Junction Size]

| Before Treatment | | After Treatment | |
|---|---|---|---|
| $\bar{I}_{18}$ [na.] | $\bar{I}_{50}$ [na.] | $\bar{I}_{18}$ [na.] | $\bar{I}_{50}$ [na.] |
| 0.20 | 0.54 | 0.029 | 0.14 |
| $\bar{I}_{50}/\bar{I}_{18}=2.7$ | | $\bar{I}_{50}/\bar{I}_{18}=4.8$ | |

Tests were conducted using other schemes to attempt to produce the same results. For example, bottled nitrogen dioxide gas was passed over the devices and some improvement was observed, but not as much as that which results from passing vapor of boiling nitric acid over the slices.

It has been found that the passing of the vapors over the slices may also be used to clean the slices before the pre-deposition diffusion process, and may be used after the diffusion has taken place to remove the organic materials upon the surface of the slices.

The vapor surface treatment may be applied at any time after diffusion. It may be applied immediately thereafter, as previously stated, or it may be applied after other cleaning steps, for example, the nitric acid vapor treatment, or it may be conducted after regular cleaning processes, for example, the process disclosed in U.S. Patent No. 3,290,180 issued Dec. 6, 1966. None of the procedures conducted on semiconductor devices after diffusion is detrimental to the improvements brought about by the nitric acid vapor treatment. Consequently, the treatment may be made immediately after diffusion or it may be delayed until after contacts have been attached to the device. The nitric acid vapor will not harm any contacts coated with aluminum or gold.

While the suitable range for the treatment of the surface has been given as between 400 and 600° C., some improvement will result below 400° C. and some will result above 600° C. The degree of improvement, however, rapidly falls off beyond either side of the preferred temperature range. In any case, the temperature should not be raised above the diffusion temperature of the device to prevent junction migration.

Although the present invention has been shown and illustrated in terms of specific preferred embodiments, it will be apparent that changes and modifications are possible without departing from the spirit and scope of the invention as defined by the appended claims.

What is claimed is:

1. A surface treatment for a semiconductor device containing a P—N junction to increase the breakdown voltage thereof, comprising the steps of placing said device in a furnace at an elevated temperature and flowing a nitric acid vapor over said device.

2. A surface treatment for a semiconductor device containing a P—N junction, comprising the steps of heating the said device to a temperature below that at which diffusion takes place, heating nitric acid to a temperature below its boiling point, bubbling a gas through the heated nitric acid to produce a vapor, and passing said vapor over said device.

3. A method for improving the reverse current and breakdown voltage characteristics of a semiconductor device, comprising the steps of heating said device to a temperature below the diffusion temperature thereof, and subjecting it to a gaseous mixture of the vapors of nitrogen and nitric acid.

4. A method for improving the electrical characteristics of a semiconductor device whereby the breakdown voltage is increased and the reverse current is reversed, comprising the steps of heating said device to a temperature of between 400° C. and 600° C., and subjecting it to a vapor containing nitric acid vapor and nitrogen.

5. A method for improving the electrical characteristics of a semiconductor device, comprising the steps of heating said device to a temperature between 400° C. and 600° C., and subjecting said device to a vapor containing a mixture of water vapor, $HNO_3$ and $HNO_3$ pyrolytic decomposition products, said vapor being produced by bubbling nitrogen gas through nitric acid which has been heated to a temperature of between 90–100° C.

References Cited

UNITED STATES PATENTS

| | | | |
|---|---|---|---|
| 3,231,422 | 1/1966 | Emeis | 117—213 |
| 3,242,007 | 3/1966 | Jensen | 117—201 |
| 3,260,626 | 7/1966 | Schink | 117—200 |
| 3,287,162 | 11/1966 | Chu et al. | 117—201 X |
| 3,290,180 | 12/1966 | Baird et al. | 117—201 X |

WILLIAM L. JARVIS, *Primary Examiner.*